(12) United States Patent
Bhattacharya et al.

(10) Patent No.: US 6,339,000 B1
(45) Date of Patent: *Jan. 15, 2002

(54) METHOD FOR FABRICATING INTERPOLY DIELECTRICS IN NON-VOLATILE STACKED-GATE MEMORY STRUCTURES

(75) Inventors: Surya S. Bhattacharya, Irvine; Shyam Krishnamurthy, Los Angeles; Hong J. Wu, Irvine; Umesh Sharma, Newport Beach, all of CA (US)

(73) Assignee: Conexant Systems, Inc., Newport Beach, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/160,834

(22) Filed: Sep. 25, 1998

(51) Int. Cl.$^7$ .............................................. H01L 21/336
(52) U.S. Cl. ........................ 438/261; 438/266; 438/287
(58) Field of Search ................................. 438/257, 266, 438/267, 261, 263, 264, 287, 593

(56) References Cited

U.S. PATENT DOCUMENTS

| | | | |
|---|---|---|---|
| 5,208,174 A | | 5/1993 | Mori |
| 5,219,774 A | * | 6/1993 | Vasche |
| 5,619,052 A | | 4/1997 | Chang et al. |
| 5,677,867 A | * | 10/1997 | Hazani .................... 365/185 |
| 5,726,087 A | | 3/1998 | Tseng et al. |

OTHER PUBLICATIONS

High Temperature Oxide For NVM Interpoly Dielectric Applications: J.A. Yater, B. Esho and W.M. Paulson; Mat. Res. Soc. Symp. Proc., vol. 532, 1998 Materials Research Society, pp. 153–158.

Polyoxide Thinning Limitation and Superior ONO Interpoly Dielectric for Nonvolatile Memory Devices; Seiichi Mori, Norihisa Arai, Yukio Kaneko, and Kuniyoshi Yoshikawa; Feb. 1991; *IEEE Transactions on Electron Devices*, vol. 38, No. 2, pp. 270–277.

High Speed Sub–halfmicron Flash Memory Technology with Simple Stacked Gate Structure Cell; Seiichi Mori, Eiji Sakagami, Yoshiko Yamaguchi, Eiji Kamiya, Masao Tanimoto, Hiroaki Tsunoda, Kiyoshi Hisatomi, Hidemitsu Egawa, Norihisa Arai, Yohei Hiura, Kuniyoshi Yoshikawa and Kazuhiko Hashimoto; 1994 Symposium on VLSI Technology Digest Technical Papers, *1994 IEEE*, pp. 53–54.

(List continued on next page.)

*Primary Examiner*—Charles Bowers
*Assistant Examiner*—Jack Chen
(74) *Attorney, Agent, or Firm*—Thomas, Kayden, Horstemeyer & Risley, LLP

(57) ABSTRACT

A method of forming an improved interpoly oxide-nitride-oxide (ONO) stricture in stacked gate memory cells is provided. The top oxide layer of an interpoly ONO stack is formed using Low Pressure Chemical Vapor Deposition (LPCVD) of tetraethylorthosilicate (TEOS). As a result of the relatively low processing temperatures necessary for this step, degradation of the tunnel oxide and memory cell performance associated with high thermal-budget oxide growth processes is greatly reduced. Steam densification of the TEOS layer produces a robust top oxide for the ONO dielectric, and thus, greatly reduces erosion of the top layer TEOS during subsequent processing steps (i.e., in the context of a memory array embedded in CMOS core technology). This step also tends to encourage formation of a very thin silicon oxynitride layer at the interface of the nitride and TEOS layers, thus helping to cure "pinholes" typically associated the nitride layer and further increasing the quality and reliability of the ONO structure. The improved interpoly ONO structure is found to show lower leakage current for applied electrice fields between 1 to 15 MV/cm as compared to prior art.

5 Claims, 3 Drawing Sheets

OTHER PUBLICATIONS

Ono Inter–Poly Dielectric Scaling for Nonvolatile Memory Applications; Seiichi Mori, Eiji Sakagami, Hitoshi Araki, Yukio Kaneko, Kazuhito Narita, Yoichi Ohshima, Noihisa Arai, and Kuniyoshi Yoshikawa; Feb. 1991; *IEEE Transactions on Electron Devices*, vol. 38, No. 2, pp. 386–391.

Scaling of Tunnel Oxide Thickness for Flash EEPROMs Realizing Stress–Induced Leakage Current Reduction; H. Watanabe, S. Aritome, G. J. Hemink, T. Maruyama and R. Shirota; 1994 Symposium on VLSI Technology Digest of Technical Papers, *1994 IEEE*, pp. 47–48.

* cited by examiner

US 6,339,000 B1

METHOD FOR FABRICATING INTERPOLY DIELECTRICS IN NON-VOLATILE STACKED-GATE MEMORY STRUCTURES

TECHNICAL FIELD

The present invention relates, generally, to methods for improving electrical reliability of stacked gate non-volatile memory by using an improved interpoly dielectric fabrication method using a top layer of densified silicon dioxide.

BACKGROUND ART AND TECHNICAL PROBLEMS

Modern semiconductor fabrication techniques allow Ultra Large Scale Integration (ULSI) and deep-submicron structures with feature sizes less than 0.35 micron. This, in turn, has driven the need to scale down nonvolatile memory arrays that are embedded in integrated circuit devices such as advanced microprocessors and microcontrollers. Electrically-Erasable and Programmable Read-Only Memory (EEPROM) and Flash EEPROM structures are often embedded in ICs to provide in-system reprogrammability. EEPROM is a nonvolatile form of memory which is alterable on a byte level, while flash-EEPROMs are configured to be programmed on a page or sector level.

Although a wide variety of memory cell structures are used in the semiconductor industry, a particularly desirable configuration is the stacked-gate structure. With reference to the cross-sectional representation shown in FIG. 1, a conventional stacked-gate memory cell 100 includes a control gate 102, a floating gate 106, and a channel region 114 located between a source 110 and drain 112 formed in substrate 116 Floating gate 106 is separated from channel 114 by oxide 108, and control gate 102 is separated from floating gate 106 by dielectric 104. Thus, the term "stacked-gate" refers to the vertically aligned nature of gate 102, gate 106, and channel 114. It will be appreciated that FIG. 1 presents a conceptual rather than a precise physical representation of a stacked-gate memory cell; certain details—side-wall dielectrics, top-side passivation, and the like—are left out for the purpose of clarity.

As gates 102 and 106 are typically fabricated from polycrystalline silicon (polysilicon, or "poly"), dielectric 104 is traditionally referred to as the "interpoly" dielectric. Moreover, due to operational details to be set forth below, oxide 108 is often referred to as the "tunnel" oxide.

Briefly, cell 100 is "discharged" by removing electrons from the floating gate 106. Conversely, the cell is "charged" by moving electrons into the floating gate 160 (as discussed below). The presence or absence of excess negative charge consisting of electrons on floating gate 106 alters the effective threshold voltage of channel 114 (i.e., the voltage necessary to invert). Thus, given a particular control gate voltage, the channel region will or will not conduct depending on the presence of excess charge. Depending on circuit design, the charged state or the discharged state can be referred to as erased state or programmed state, respectively, or vice versa.

Those skilled in the art will realize that operation of cell 100—particularly with respect to channel region 114—will depend upon whether the cell utilizes an enhancement mode or depletion mode FET. Without loss of generality, however, the following discussion assumes operation in a depletion mode (i.e., n+ source and drain, p+ channel).

As mentioned briefly above, cell 100 is charged by transferring electrons to the floating gate 106. This charge transfer to the floating gate 160 is typically accomplished through channel hot electron (CHE) injection or by Fowler Nordheim (FN) tunneling across the tunnel oxide 108. Discharging the cell 100 by removing electrons is achieved typically from floating gate 106, is typically achieved by FN tunneling across the tunnel oxide 108.

Charge retention capability is critical to floating gate structures. That is, inasmuch as the primary functional of a memory cell is to store a binary value, its ability to retain a charge on the floating gate is an important indicator of reliability. Charge retention is a function of a number of factors, for example, the quality of the tunnel oxide and the materials and geometry of the interpoly dielectric. Toward this end, for reasons discussed further below, modern stacked-gate cells typically employ a three-layer interpoly structure consisting of oxide, nitride, and oxide (or oxynitride) rather than a layer (or layers) of silicon-dioxide (e.g., oxide 104 in FIG. 1). This system is referred to as the "interpoly ONO".

In an interpoly ONO structure (illustrated in FIG. 2), a first layer of thermal oxide 202 is disposed by thermal oxidation of the floating gate electrode 106. A layer of silicon nitride 204 ("nitride") is then deposited on oxide 202, typically using well known methods of Chemical Vapor Deposition (CVD). A layer 206 of oxide or silicon oxynitride is then formed—typically using a thermal oxidation process in steam ambience—and control gate 102 is then deposited on oxide or oxynitride 206.

This three-level interpoly ONO structure, while superior to a single oxide level, nevertheless has some drawbacks. First, forming the top layer using prior art techniques still requires a high "thermal budget" process, i.e., steam oxidation of the nitride layer, wherein the device may reach temperatures as high as 925° C. for up to 180 minutes. This form of high-temperature processing is not suitable for sub-half-micron technology as it is known that high temperature processing steps incurred subsequent to deposition of the tunnel oxide can degrade tunnel oxide 108 material.

Background information and various details regarding ONO and tunneling oxide structures in the context of memory cells can be found in a number of documents, for example: Mori, et al., *Polyoxide Thinning Limitation and Superior ONO Interpoly Dielectric for Nonvolatile Memory Devices*, IEEE TRANS. ON ELECT. DEV. 270, (Vol 38, No. 2, February, 1991); Mori, et al., *High Speed Sub-halfmicron Flash Memory Technology with Simple Stacked Gate Structure Cell*, IEEE SYMPOSIUM ON VLSI TECHNOLOGY 53 (1994). Mori, et al., *ONO Inter-Poly Dielectric Scaling for Nonvolatile Memory Applications*, IEEE TRANS. ON ELECT. DEV 386 (Vol. 38, No. 2, February 1991); and Mori, et al., *Scaling of Tunnel Oxide Thickness for Flash EEPROMs Realizing Stress-Induced Leakage Current Reduction*, 1994 SYMPOSIUM ON VLSI TECHNOLOGY 47 (1994).

Methods are thus needed to overcome these and other shortcomings in the prior art. Specifically, methods are needed for forming reliable, scalable, and manufacturable interpoly ONO structures which minimize tunnel oxide degradation.

SUMMARY OF THE INVENTION

The above disadvantages of the prior art may be addressed by an improved interpoly dielectric process. Methods in accordance with the present invention provide an improved interpoly dielectric structure using a densified top dielectric layer. In accordance with one aspect of the present invention, the top oxide layer of the interpoly ONO dielectric stack is formed using Low Pressure Chemical Vapor Deposition (LPCVD) of tetraethylorthosilicate (TEOS). As a result of the relatively low processing temperatures (i.e., less than about 700° C.) necessary for this step, degradation of the tunnel oxide and memory cell performance associated with high thermal-budget oxide growth processes is avoided.

In accordance with another aspect of the present invention, the top dielectric layer (e.g., TEOS) is densified using a densification process in steam ambience. This step greatly reduces erosion of the top layer TEOS during subsequent processing steps (i.e., in the context of a memory any embedded in CMOS core technology). Furthermore, this step tends to encourage formation of a thin silicon oxynitride layer at the interface of the nitride and TEOS layers, thus helping to cure "pinholes" typically associated the nitride layer and further increasing the quality and reliability of the ONO structure.

BRIEF DESCRIPTION OF THE DRAWING FIGURES

The subject invention will hereinafter be described in conjunction with the appended drawing figures, wherein like numerals denote like elements, and:

Figure 1:
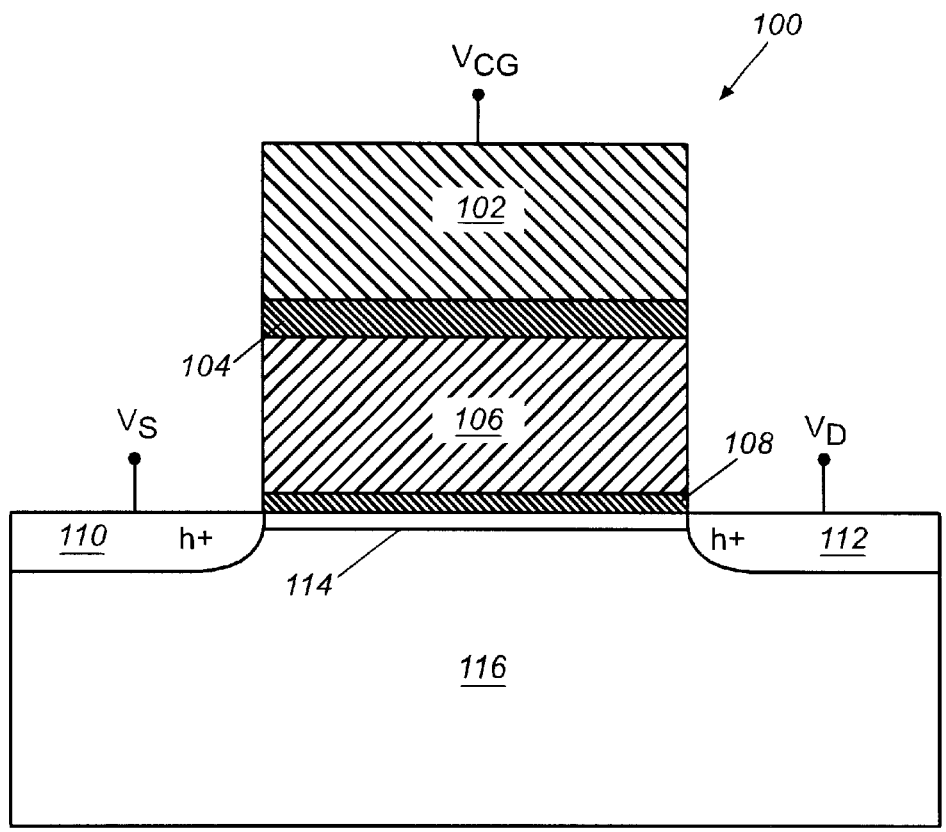
FIG. 1 shows a cross-sectional view of a typical floating-gate nonvolatile memory cell.
Figure 2:
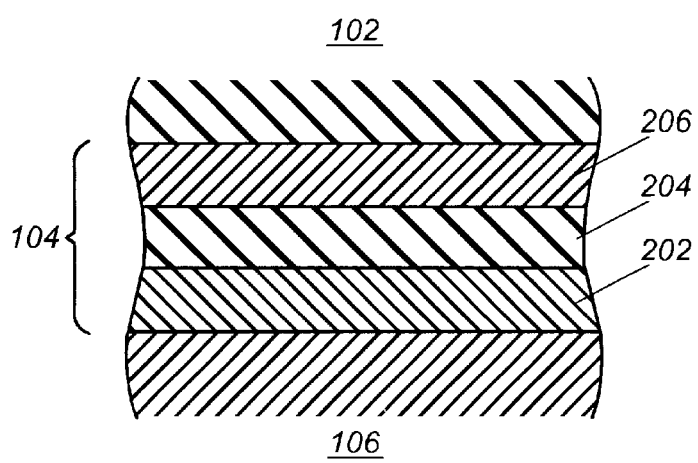
FIG. 2 shows a close-up of a standard prior art oxide-nitride-oxide structure used as an interpoly dielectric.
Figure 3:
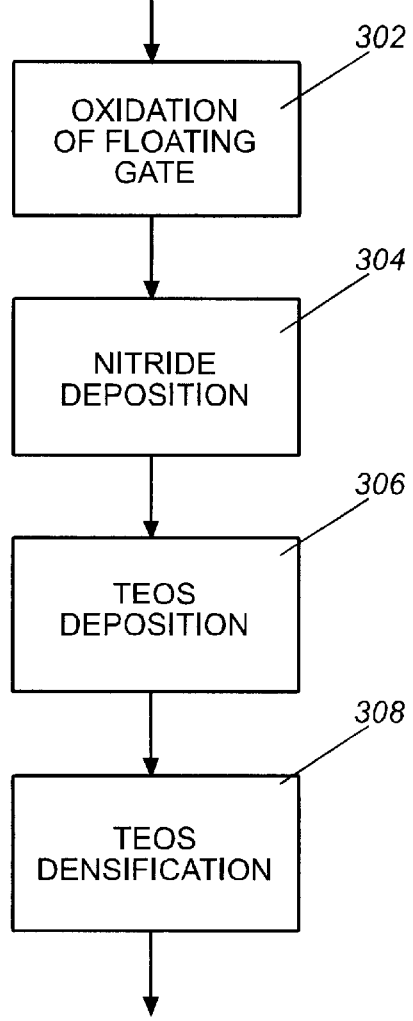
Figure 4A:
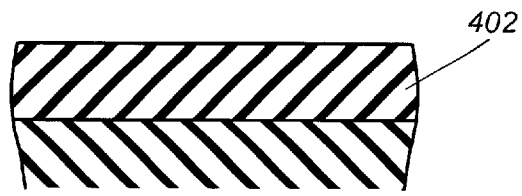
Figure 4B:
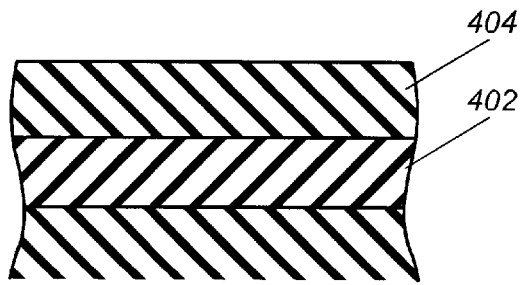
Figure 4C:
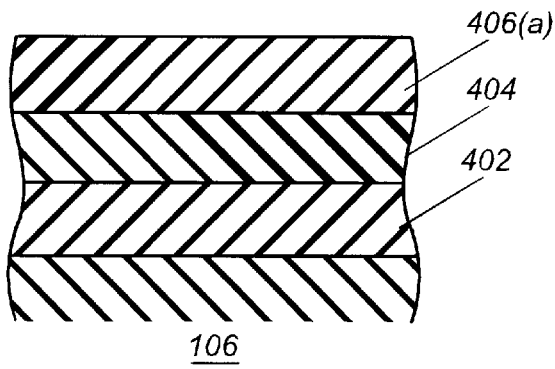
Figure 4D:
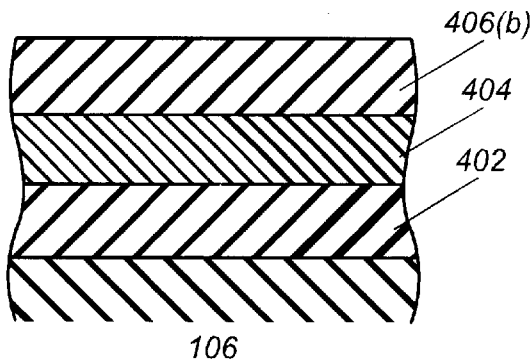
Figure 5:
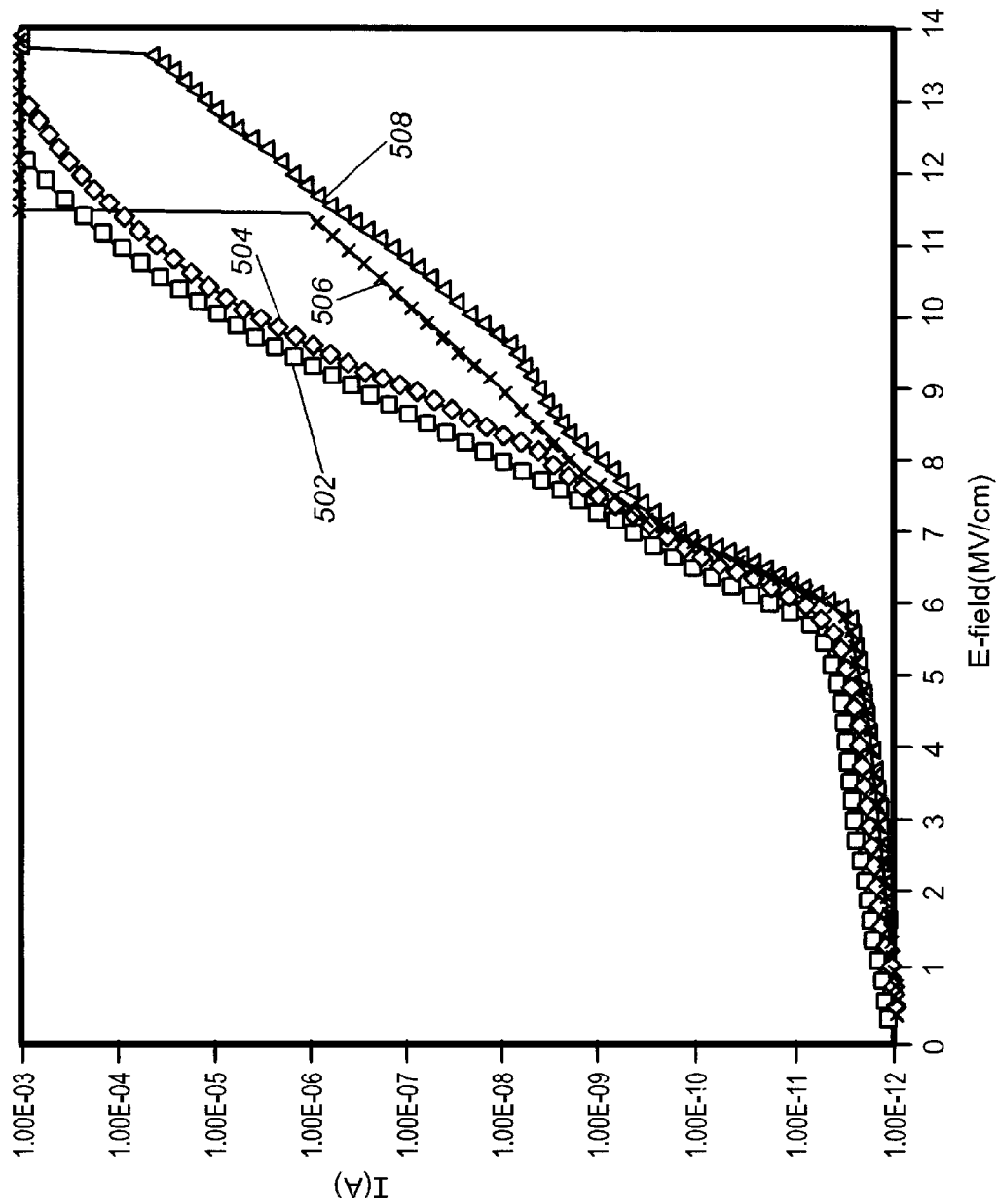

FIG. 3 is an exemplary flowchart showing an improved oxide-nitride-oxide deposition process in accordance with the present invention; and FIGS. 4A–4D show a series of close-up schematic cross-sectional views of an exemplary oxide-nitride-oxide structure as it is processed in accordance with the methods of the present invention; and FIG. 5 presents empirical results related to leakage current in various interpoly dielectric structures.

Figure 6:
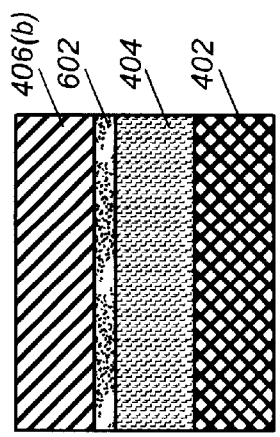

FIG. 6 shows a cross-sectional view of an exemplary oxide-nitride-oxide layer after formation of a thin oxy-nitride layer.

DETAILED DESCRIPTION OF PREFERRED EXEMPLARY EMBODIMENTS

A method of forming an interpoly dielectric layer in accordance with various aspects of the present invention involves depositing a top oxide layer using a low temperature process, for example, CVD of TEOS, followed by a densification step which results in a high-reliability, low thermal-budget top oxide. With momentary reference to FIG. 4D, an exemplary interpoly dielectric in accordance with the present invention comprises a bottom oxide 402 formed on floating gate 106, a nitride layer 404, and a densified oxide layer 406(b).

Referring now to FIGS. 3 and 4, an exemplary method of forming an improved interpoly dielectric structure will now be described in detail. It should be understood that the exemplary process illustrated may include more or less steps or may be performed in the context of a larger processing scheme In Step 302, a dielectric layer 402 is formed on floating gate 106 using a suitable deposition technique (FIG. 4A). In a preferred embodiment, this step is carried out via thermal oxidation of a polysilicon gate 106 to form a dielectric layer 402 comprising thermally grown silicon dioxide with a thickness of approximately 60–100 Å. Other conventional and unconventional methods may be used for depositing oxide layer 402. In addition, it is conceivable that dielectric materials other than silicon dioxide may be used for this layer. That is, the use of the acronym "ONO", and the use of silicon dioxide and silicon nitride in various illustrated exemplary embodiments that follow are not meant to limit the scope of the present invention.

In Step 304, a second dielectric layer 404 is formed on dielectric 402 as shown in FIG. 4B using any suitable conventional technique. In an exemplary embodiment, dielectric 404 comprises a layer of silicon nitride, deposited using conventional CVD techniques, with a thickness of about 60 Å to 110 Å, preferably about 100 Å.

Having thus formed two layers of the interpoly dielectric, a third dielectric layer 406(a) is deposited as shown in FIG. 4C (Step 306). In a preferred embodiment, dielectric layer 406(a) comprises TEOS with an as-deposited thickness, preferably about 60 to 100 Å.

In order to reduce the effective thermal budget experienced during processing, it is desirable that Step 306 be carried out using a low-temperature deposition process. Toward that end, oxide layer 406(a) is deposited using a Low Pressure Chemical Vapor Deposition (LPCVD) process carried out by decomposition of TEOS/$N_2$ gas at approximately 180 mTorr and 650° C. for 8–14 minutes, preferably about 12 minutes. Such a recipe will typically result in an as-deposited TEOS thickness of about 65 Å. Many commercial systems are suitable for this deposition step, including, for example, the Model BTI APOGEE-1 LPCVD system manufactured by Kokusai BTI Corporation of North Billerica, Mass. Other deposition techniques, for example, plasma-enhanced CVD, may be advantageously employed depending on the particular choice of dielectric materials.

In Step 308, densification of dielectric 406(a) is performed, resulting in a densified layer 406(b) as shown in FIG. 4D. Densification involves exposing the structure to a substantially constant temperature within a particular ambient atmosphere, for example, steam, nitrogen, oxygen, or a mixture thereof. This step slightly reduces the thickness and increases the density of dielectric 406(b) and results in a higher quality oxide (discussed in further detail below). In a preferred embodiment, steam densification is employed for Step 308. More particularly, dielectric 406(b) is preferably densified at approximately 800° C. to 850° C. in a high-purity steam environment for about 15 to 40 minutes, preferably about 20 minutes. After densification, the chamber is preferably purged (with nitrogen), and the wafers are allowed to cool to ambient temperature slowly (at approximately 3° C. per minute). Many commercial furnaces are suitable for this densification step, including, for example, the Model BTI APOGEE-1 vertical furnace, manufactured by Kokusai BTI Corporation of North Billerica, Mass.

In the context of the present invention—particularly in the illustrated embodiment wherein dielectric 406(a) comprises a CVD TEOS layer—it has been found that steam densification produces superior performance. Specifically, electrical testing has confirmed lower leakage and improved reliability in steam-densified cells as compared to $N_2$ and $O_2$ densified cells. Second, the effective TEOS thickness remaining after complete processing is higher with steam densification. This is important in an embedded memory processing sequence where the top layer 406(b) of the interpoly dielectric is subjected to several pre-furnace and photoresist stripping steps which have been found to cause erosion of 406(b) if densification of 406(a) is done in ambient such as nitrogen or argon where steam is not used.

Erosion of the top oxide, 406(b) results in an unacceptable thickness variation of the interpoly ONO.

Furthermore, it is hypothesized that this densification step tends to encourage formation of a very thin silicon oxynitride layer at the interface of the nitride and TEOS layers (illustrated as layer 602 in the cross-section shown in FIG. 6), thereby helping to cure "pinholes" typically associated the nitride layer and further increasing the quality and reliability of the ONO structure.

As mentioned briefly above, steam densification of TEOS for the top layer of the interpoly dielectric structure is unexpectedly efficacious with respect to electrical performance. In this regard, FIG. 5 shows particularly illustrative empirical results, wherein the x-coordinate axis represents the applied field across the interpoly dielectric (in voltage per unit length), and the y-coordinate axis represents leakage current (on a logarithmic scale) observed across the interpoly dielectric in suitable test structures. X-coordinate axis is chosen to be the applied electric field in order to normalize the leakage current with respect to small thickness changes between different interpoly ONO dielectrics considered. Data series 502 and 504 represent art interpoly dielectric structures wherein the top level comprises a silicon dioxide layer formed through steam oxidation at approximately 900° C. In the case of data series 502, oxidation was carried out for 30 minutes, resulting in a total interpoly dielectric thickness of about 170 Å. In the case of data series 504, oxidation was carried out for 60 minutes, resulting in a total interpoly dielectric thickness of about 174 Å. In each case, the bottom layer consists of thermally grown oxide, and the middle layer consists of CVD silicon nitride.

Data series 506 represents the case where the top dielectric layer comprises CVD TEOS deposited at about 850° C. for 30 minutes followed by steam densification as detailed above. The total thickness of the interpoly dielectric in the latter case is approximately 180 Å.

In general, all other things being equal, it is desirable to have lower leakage current at a given value of applied field. It is generally known that properly performed dielectric leakage measurements tend to correlate to data retention rates. Thus, processes represented by data series 506 and 508 are superior to 502 and 504 at electrical fields between 5 and 10 MV/cm, and the process represented by data series 508—i.e., an illustrated embodiment of the present invention—shows the best performance.

Moreover, it has been found that steam densification tends to produce a higher quality TEOS than that produced through conventional densification processes. For example, experiments were designed to compare the stoichiometry of oxides produced through various densification processes. In each case, Auger chemical analysis was performed in order to measure the atomic concentration of silicon and oxygen in the oxide, wherein the ideal oxygen-to-silicon ratio is 2:1 ($SiO_2$). Tests demonstrated that steam-densified TEOS produced an oxygen-to-silicon ratio of about 2:1 (66.73% O, 33.27% Si), while nitrogen-densified TEOS produced an oxygen-to-silicon ratio of about 1.67:1 (62.62% O, 37.38% Si).

Although the invention has been described herein in conjunction with the appended drawings, those skilled in the art will appreciate that the scope of the invention is not so limited. Modifications in the selection, design, and arrangement of the various components and steps discussed herein may be made without departing from the scope of the invention as set forth in the appended claims. In addition, the ONO dielectric formation technique in this invention can be used to form precision capacitors in analog and mixed-signal integrated circuits. Furthermore, the CVD TEOS oxide densification technique can be used to make oxide-only capacitors for integrated circuits.

What is claimed is:

1. A method for forming a stacked-gate flash memory cell, said method comprising the steps of:
   (a) forming a tunnel oxide on a channel region;
   (b) forming a floating gate electrode on said tunnel oxide, wherein said forming the floating gate electrode comprises a step of depositing a layer of polysilicon;
   (c) forming a multi-layer dielectric on said floating gate electrode, wherein said forming said multi-layer dielectric comprises the steps of:
      depositing a first silicon dioxide layer on said floating gate electrode;
      depositing a silicon nitride layer on said first silicon dioxide layer;
      depositing a second silicon dioxide layer on said silicon nitride layer using chemical vapor deposition, wherein said second silicon dioxide layer comprises tetraethylorthosilicate; and
      densifying said second silicon dioxide layer using steam densification, wherein said densifying step includes a step of forming a layer of silicon oxynitride at an interface of said silicon nitride layer and said second silicon dioxide layer;
   (d) forming a control gate electrode on said densified second silicon dioxide layer, wherein said forming said control gate electrode comprises a step of depositing a layer of polysilicon.

2. The method of claim 1, wherein said second silicon dioxide layer is deposited using low pressure chemical vapor deposition at a temperature of about 850° C. for about 15 to 30 minutes.

3. The method of claim 1, wherein said densifying step comprises densifying said second silicon dioxide layer using steam densification at a temperature of about 850° C. for about 15 to 40 minutes.

4. The method of claim 1, wherein said step of forming said second silicon dioxide layer comprises the step of forming said second silicon dioxide such that a thickness of said second silicon dioxide layer is between about 60–100 Angstroms.

5. The method of claim 1, wherein said densifying step includes the step of reducing pinholes present in said silicon nitride layer after said step of depositing said silicon nitride layer.

* * * * *